United States Patent [19]

Curry, II

[11] Patent Number: 5,142,828

[45] Date of Patent: Sep. 1, 1992

[54] CORRECTING A DEFECTIVE METALLIZATION LAYER ON AN ELECTRONIC COMPONENT BY POLISHING

[75] Inventor: John W. Curry, II, Austin, Tex.

[73] Assignee: Microelectronics and Computer Technology Corporation, Austin, Tex.

[21] Appl. No.: 544,000

[22] Filed: Jun. 25, 1990

[51] Int. Cl.⁵ ............................................. B24B 1/00
[52] U.S. Cl. ................................. 51/281 R; 51/317; 427/142
[58] Field of Search ................. 51/281 R, 283 R, 317; 156/645, 656, 665; 427/58, 92, 140, 142, 298, 290, 307

[56] References Cited

U.S. PATENT DOCUMENTS

| | | | |
|---|---|---|---|
| 3,959,934 | 6/1976 | Bryne | 51/283 R |
| 3,971,169 | 7/1976 | Bryne | 51/283 R |
| 4,702,792 | 10/1987 | Chow et al. | 156/628 |
| 4,735,679 | 4/1988 | Lasky | 156/636 |
| 4,793,895 | 12/1988 | Kaanta et al. | 156/627 |
| 4,810,332 | 2/1989 | Pan | 204/15 |
| 4,829,243 | 5/1989 | Woodard, Sr. et al. | 324/158 |
| 4,874,463 | 10/1989 | Koze et al. | 156/645 |
| 4,879,258 | 11/1989 | Fisher | 437/225 |
| 4,944,836 | 7/1990 | Beyer et al. | 156/645 |
| 4,956,313 | 9/1990 | Cote et al. | 437/203 |
| 4,985,306 | 1/1991 | Morizane et al. | 428/410 |
| 5,011,580 | 4/1991 | Pan et al. | 204/15 |
| 5,071,518 | 12/1991 | Pan | 204/15 |

FOREIGN PATENT DOCUMENTS

| | | | |
|---|---|---|---|
| 0310357 | 9/1988 | European Pat. Off. | |
| 1259931 | 10/1989 | Japan | 427/142 |

OTHER PUBLICATIONS

Surfacetech Review, Rodel Products Corp. Mar. 1990, vol. 1, Issue 8.
Surfacetech Review, Rodel Products Corp., May 1989, vol. 1, Issue 6.
Surfacetech Review, Rodel Products Corp., Oct. 1989, vol. 1, Issue 7.
Surfacetech Review, Rodel Products Corp., Feb. 1988, vol. 1, Issue 4.
Surfacetech Review, Rodel Products Corp., Oct. 1988, vol. 1, Issue 5. Riley et al., "Planarization of Dielectric Layers for Multilevel Metallization", Transactions On Semiconductor Manufacturing, Nov. 1988, vol. 1, No. 4, pp. 154–156.
Mutter, "Choice Stop Material For Chemical/Mechanical Polish Planarization", IBM Technical Disclosure Bulletin, Jan. 1985, vol. 27, No. 8, p. 4642.
Beyer et al., "Glass Planarization By Stop Layer Polishing", IBM Technical Disclosure Bulletin, Jan 1985, vol. 27, No. 8, pp. 4700–4701.
Barson et al., "Chemical Vapor Deposited Device Isolation With Chemical/Mechanical Planarization", IBM Technical Disclosure Bulletin, Jul. 1986, vol. 29, No. 2, pp. 577–579.
Surfacetech Review, Rodel Products Corp., Dec. 1986, vol. 1, Issue 1.
Surfacetech Review Rodel Products Corp., Mar. 1987, vol. 1, Issue 2.
Surfacetech Review, Rodel Products Corp., Sep. 1987, vol. 1, Issue 3.
Bennett et al. "Selective Planarization Process and Structures", IBM Technical Disclosure Bulletin, Sep. 1984, vol. 27, No. 4B, pp. 2560–2563.
Koburger, "Trench Planarization Technique", IBM Technical Disclosure Bulletin, Nov. 1984, vol. 27, No. 6, pp. 3242–3243.
Hamaguchi et al., "Hydrostatic Float Polishing For Wafer Preparation", Review of Scientific Instruments, Nov. 1984, vol. 55, No. 11, pp. 1867–1868.

*Primary Examiner*—M. Rachuba
*Attorney, Agent, or Firm*—David M. Sigmond

[57] ABSTRACT

A defective metallization layer is removed from the top of an electronic component such as an integrated circuit or a copper/polyimide substrate by polishing with a rotating pad and a slurry. Non-defective underlying metallization layers are preserved and a new metallization layer is fabricated to replace the defective layer.

14 Claims, 4 Drawing Sheets

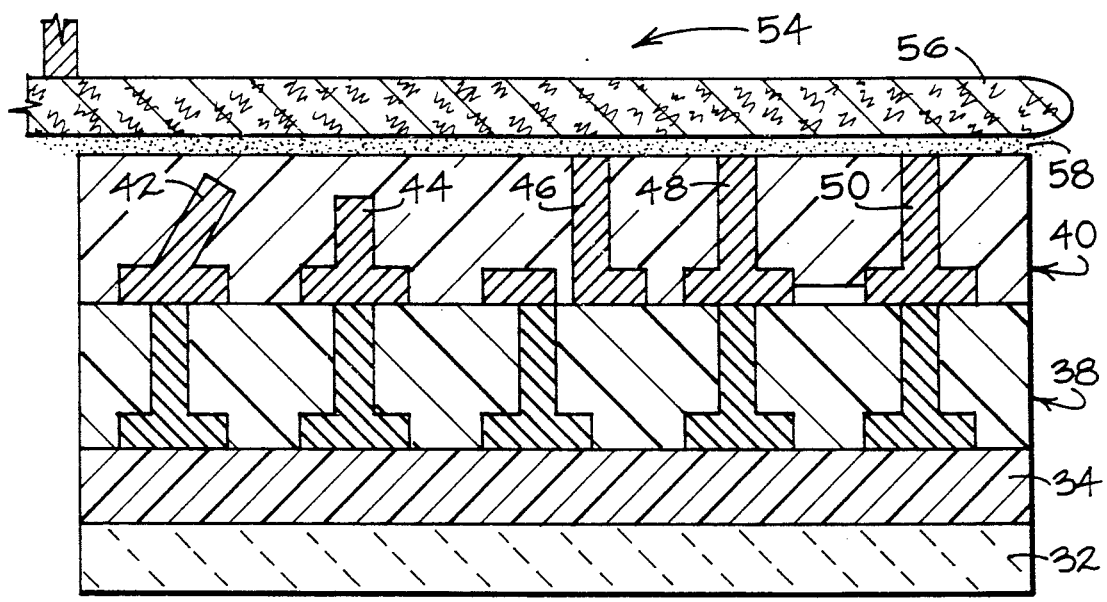
FIG. 4
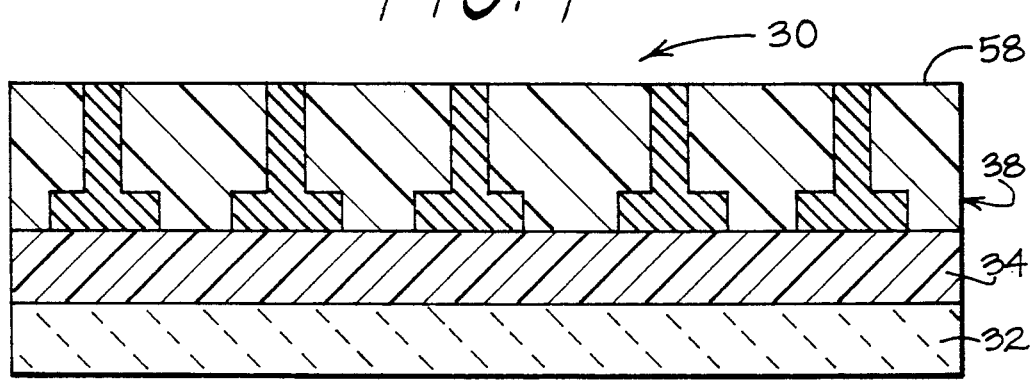
FIG. 5
FIG. 6
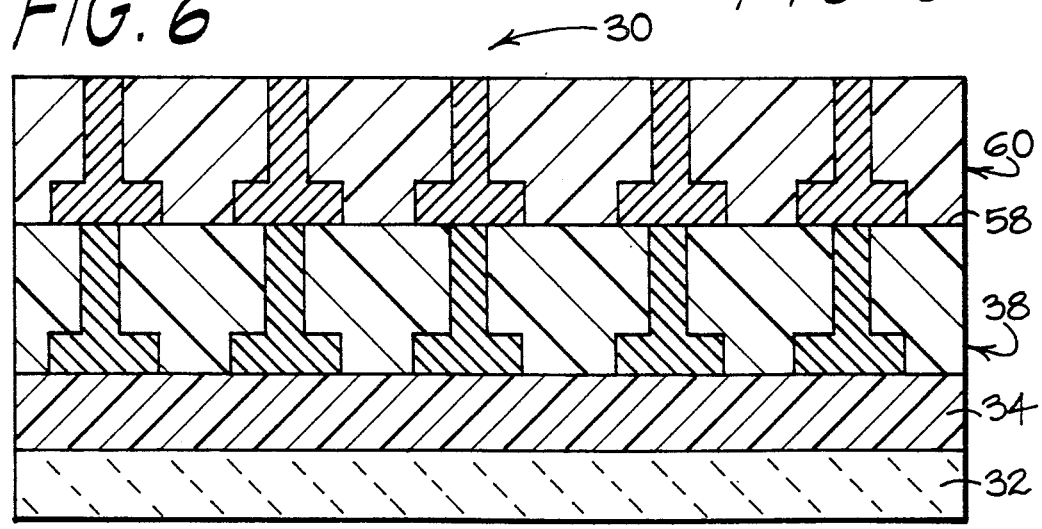

CORRECTING A DEFECTIVE METALLIZATION LAYER ON AN ELECTRONIC COMPONENT BY POLISHING

BACKGROUND OF THE INVENTION

Advances in integrated circuits used in high performance systems have also created a demand for high density electrical interconnects to accommodate large numbers of inputs and outputs. Methods of manufacturing high density substrates are known to those having skill in the art, as described in U.S. Pat. No. 4,810,332 and in Jensen et al., "Copper/Polyimide Materials for High Performance Packaging," *IEEE Transactions on Components, Hybrids, and Manufacturing Technology,* Vol. CHMT-7 #4, pp. 383-393 (December, 1984).

Fabrication of electronic components such as integrated circuits and high density copper/polyimide substrates invariably includes a certain percentage of defective units, for instance from short-circuited connections or electrical openings. These defects are usually detected during manufacturing by mechanical, optical, or voltage contrast electron beam testing and the like. Or a customized metal layer which is properly constructed may be defective as a result of new routing requirements. Various options may be available to rework these defects. A short-circuit could be severed by a laser beam or an ion beam. An open line could be closed by laser deposition, laser chemical vapor deposition, chemical vapor deposition, or ink jet metal deposition. Nevertheless, it may not be feasible or possible to repair a defect without fabricating the entire layer again. It would be highly advantageous to rework a defective layer on an integrated circuit of a multilevel substrate without damaging the underlying layers so that the remainder of the electronic component can be salvaged.

SUMMARY OF THE INVENTION

The present invention is directed to an easy and economical method of correcting a defective metallization layer on an electronic component such as an integrated circuit or substrate by polishing.

One feature of the present invention is wherein the top defective metallization layer is a customized layer that is no longer suitable for its intended application.

Another feature of the present invention is wherein the top defective metallization layer contains a structural flaw, such as a short-circuit, an open-circuit, or an unwanted interlayer via.

Yet a further feature of the present invention is wherein polishing is done by a rotating pad with a slurry.

Further objects, features and advantages will be apparent from the following description of presently preferred embodiments of the invention, given for the purpose of disclosure and taken in conjunction with the accompanying drawings.

BRIEF DESCRIPTION OF THE DRAWINGS

FIG. 4 is a cross-sectional view similar to FIG. 2 wherein a rotating pad removes the defective metallization layer by polishing.

FIG. 5 is a cross-sectional view similar to FIG. 2 wherein the defective metallization layer is removed.

FIG. 6 is a cross-sectional view similar to FIG. 2 wherein a new metallization layer is fabricated to replace the defective metallization layer.

DETAILED DESCRIPTION OF PREFERRED EMBODIMENTS

The present invention for correcting a defective metallization layer on an electronic component by polishing is now described. While the present invention is applicable to a wide variety of electronic components with substantially planar layers, such as integrated circuits and multilayer electrical interconnects, for illustration purposes a substrate will be described in the embodiments to follow.

Figure 1:
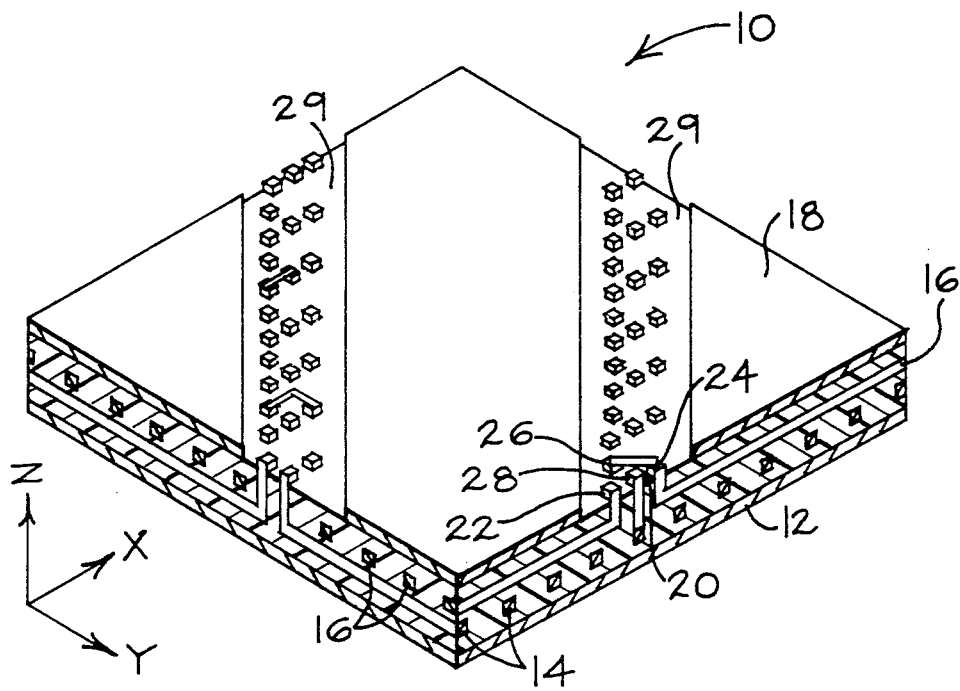
FIG. 1 is an isometric view of a presently available customizable high density copper/polyimide multilayer substrate.

Referring now to the drawings and particularly FIG. 1, reference numeral 10 generally indicates a substrate with substantially planar layers which is presently available, such as the customizable high density copper/polyimide substrate disclosed in European Patent Application EP 0 310 357 A2 entitled "Customizable Circuitry" by Carey. As illustrated, substrate 10 comprises an optional first plane 12 which can be an electrically conductive plane, for example a power or ground plane. Extending above plane 12 is a plurality of parallel co-planar y-wires 14. Extending above y-wires 16, 14 are a plurality of parallel co-planar x-wires 16 essentially perpendicular to y-wires 14. Customization plane 18 is positioned above x-wires 16. X- and y-wires 14, 16 are formed into segments which terminate at overlap 20. Terminal portions 22, 24 of x-wires 16 and terminal portions 26, 28 of y-wires 14 provide programmable junctions on diagonal tracks 29.

Figure 2:
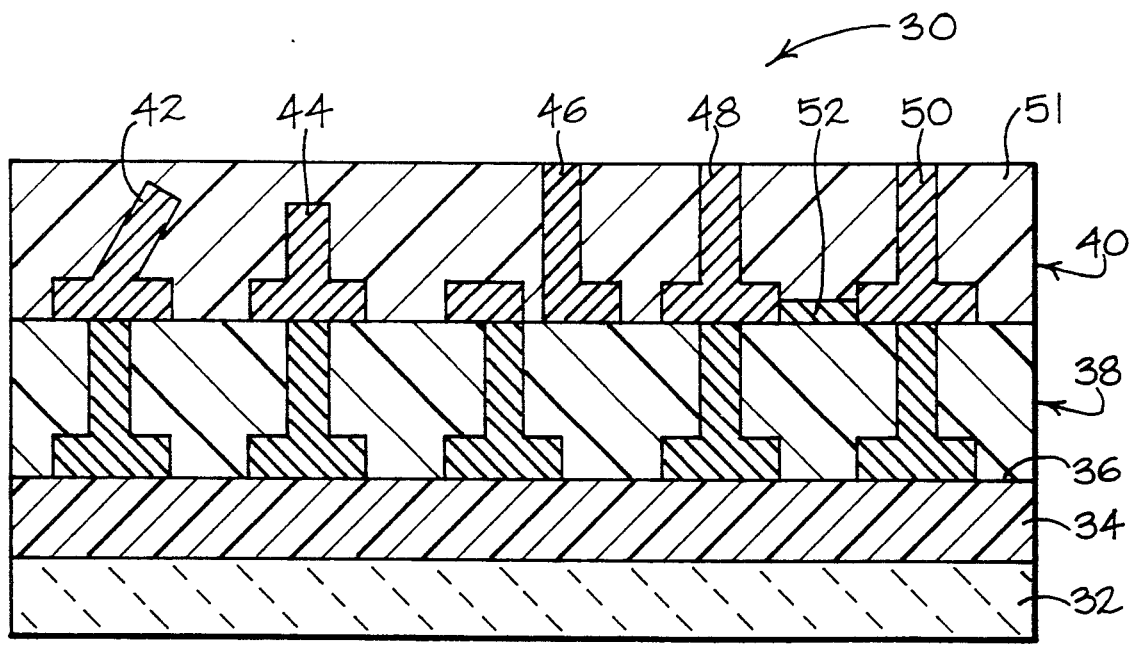
FIG. 2 is a cross-sectional view of another substrate with a defective top metallization layer.

FIG. 2 illustrates a cross-sectional view of another copper/polyimide multilayer substrate 30 which has a different metallization pattern than substrate 10 for illustration purposes. Preferably substrate 30 includes a base 32, such as alumina ceramic, glass ceramic, silicon or various metals. Base 32 is covered with polyimide layer 34 having a polished top surface 36. Polyimide layer 34 has a suitable thickness for high density interconnection, such as 10 microns. The present invention is well suited for substrates with additional metallization layers, shown as metallization layer 38, between defective metallization layer 40 and base 32. For example the present invention can rework the upper layer of a four-layer substrate while leaving the underlying layers undisturbed. It may not be preferred to use polishing to remove the bottom metallization layer of a substrate since this might be done without regard to salvaging underlying metallization layers in simpler ways, for instance a blanket etch. However, removal of a defective layer which is positioned above one or more good layers by polishing is advantageous since the underlying layers are preserved, whereas refabrication of the underlying layers or the entire substrate requires expensive, time-consuming processing.

Testing may not be necessary to determine whether a metallization layer is defective. For instance a customized layer which is no longer suitable for a new routing configuration would be considered defective and in need of rework. In the event the design of the metallization layer is acceptable, preferably the substrate is tested for defects prior to continued fabrication or mounting of surface components thereon.

Numerous techniques exist for testing high density substrates. U.S. Pat. No. 4,829,243 entitled "Electron Beam Testing Of Electronic Components" by Woodard et al. which issued May 9, 1989 discloses an electron beam testing apparatus for applying an electron beam to parts of a substrate and measuring the secondary electrons released from the substrate including a secondary electron collector having a plurality of vertically extending screens with a detector positioned adjacent one of the screens. A different voltage is applied to each of the screens of the collector for collecting the secondary electrons over a large area.

Figure 3:
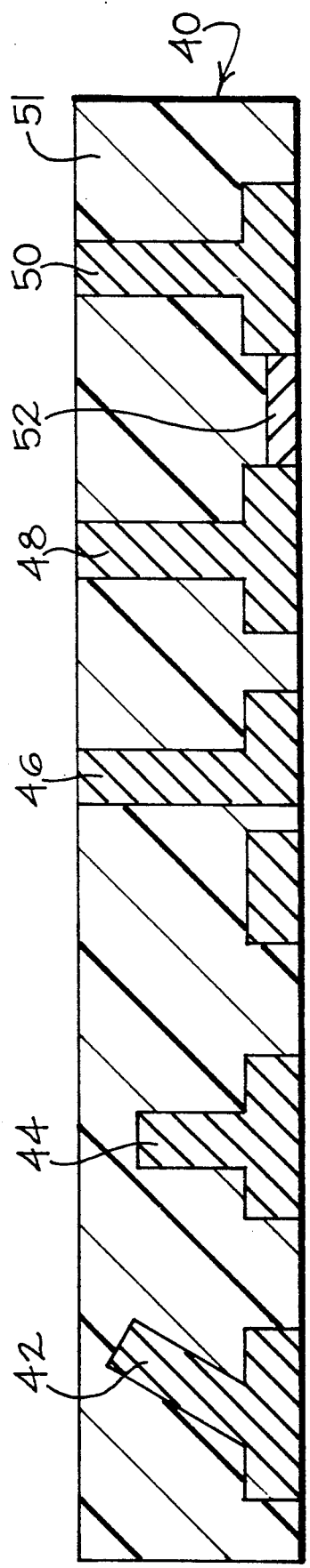
FIG. 3 is an enlarged cross-sectional view of the defective metallization layer of FIG. 2.

FIG. 3 is an enlarged sectional view of defective metallization layer 40 consisting of defective metal segments 42, 44, 46, 48 and 50 enclosed by polyimide layer 51. Several defects exist: segment 42 is bent, segment 44 is too low, segment 46 has an electrical opening, and segments 48 and 50 are short-circuited together by metal fragment 52.

FIG. 4 illustrates polishing means 54 for polishing and removing defective metallization layer 40. Polishing means 54 can be mechanical, chemical-mechanical or electro-chemical. The use of polishing merely to achieve planarization as part of a normal processing sequence is well known in the art; see, for instance, C. W. Koburger, "Trench Planarization Technique," *IBM Technical Disclosure Bulletin*, Vol. 27, No. 6, pp. 3242-3243 (Nov. 1984) and K. D. Beyer et al., "Glass Planarization By Stop-Layer Polishing," *IBM Technical Disclosure Bulletin*, Vol. 27, No. 8, pp. 4700-4701 (Jan. 1985). Preferably polishing means 54 is a uniform and non-selective mechanical polishing performed by a rotating pad 56 and slurry 58 to grind away defective layer 40. Pad 56 can be composed of a felt fiber fabric impregnated with polyurethane. Prior to impregnation with polyurethane pad 56 is soft. The amount of polyurethane impregnation determines how hard pad 56 will become, that is whether pad 56 is relatively hard or soft. While the hardness of pad 56 is a matter of degree, it is useful for discussion purposes to categorize the pad as a "hard pad" or a "soft pad." A hard pad may grind away material faster than a soft pad, and a hard pad is less prone to conform with surface unevenness or remove different materials (such as copper and polyimide) at different rates. However, a hard pad is also more likely to tear-away the defective metallization layer and quite possibly destroy the substrate, and a hard pad creates a rougher surface finish than a soft pad. Selection of the best pad depends on requirements such as surface planarity, surface smoothness, the materials to be polished, and the slurry employed. For instance tungsten may require a harder pad than copper. The use of conventional polishing pads for silicon and gallium-arsenide are well known to those skilled in the art, and can be obtained from Rodel Products Corp. or Rippey Corp. A slurry specific to the type of metal in layer 40 can be dispensed onto the rotating pad 56 to assist with the polishing. For a copper layer 40 a preferred slurry is alumina grit with alumina particles between 0.05-3.0 microns suspended in solution. Slurries used for other metals include silicon carbide and diamond paste.

In one experiment a 17 micron thick copper layer was removed in 62 minutes using a Westech polisher with a Diamex Alpha 125-015 pad at 6 PSI and 250 RPMs with a 0.05 CR Baikalox slurry 2:1 dispensed at 170 milliliters per minute. In another experiment using a Westech polisher with a Rodel H1 pad at 6 PSI and 250 RPMs and Rodel R30 slurry dispensed at 170 milliliters per second a 17 micron copper/polyimide layer was removed in 10 minutes. In both experiments metallization beneath the removed layer was not damaged.

FIG. 5 illustrates the removal of defective metallization layer 40 by polishing. Polishing is discontinued by separating polishing means 54 from substrate 30. In accordance with the present invention substrate 30 can now be reworked by fabricating a new metallization layer to replace defective layer 40.

FIG. 6 illustrates the fabrication of new metallization layer 60 on surface 58. Conventional methods for fabricating layers of copper channels and vias in polyimide substrates are known to those with skill in the art. For example, U.S. Pat. No. 4,810,332 entitled "Method of Making An Electrical Multilayer Copper Interconnect" by Pan which issued Mar. 7, 1989 discloses a method of making an electrical multilayer copper interconnect in which the electrical lines are protected by an electroplated overcoat. A plating interconnect is deposited on a substrate, a sacrificial layer of dielectric material is deposited on the plating interconnect, and a plating mask is formed on the dielectric material. Two self-aligning plating masks are patterned in one step, one of which is a plating mask for copper plating and the other is a plating mask for the overcoat. Before electroplating the overcoat, the copper can be etched for exposing the sides adjacent the dielectric layer for allowing overcoating of all the copper. See also U.S. Ser. No. 07/426,619 filed Oct. 24, 1989 entitled "Method of Making an Electrical Multilayer Interconnect" by Pan.

If new layer 60 or any additional layers fabricated thereon are found to be defective then they too can be reworked. Alternatively, if metallization defects are detected prior to applying the polyimide enclosure, then other repair techniques may be suitable. For instance, short-circuited connections can be severed by a laser beam or an ion beam, and opened segments can be connected by laser deposition, laser chemical vapor deposition, chemical vapor deposition, or ink jet metal deposition.

Figure 7:
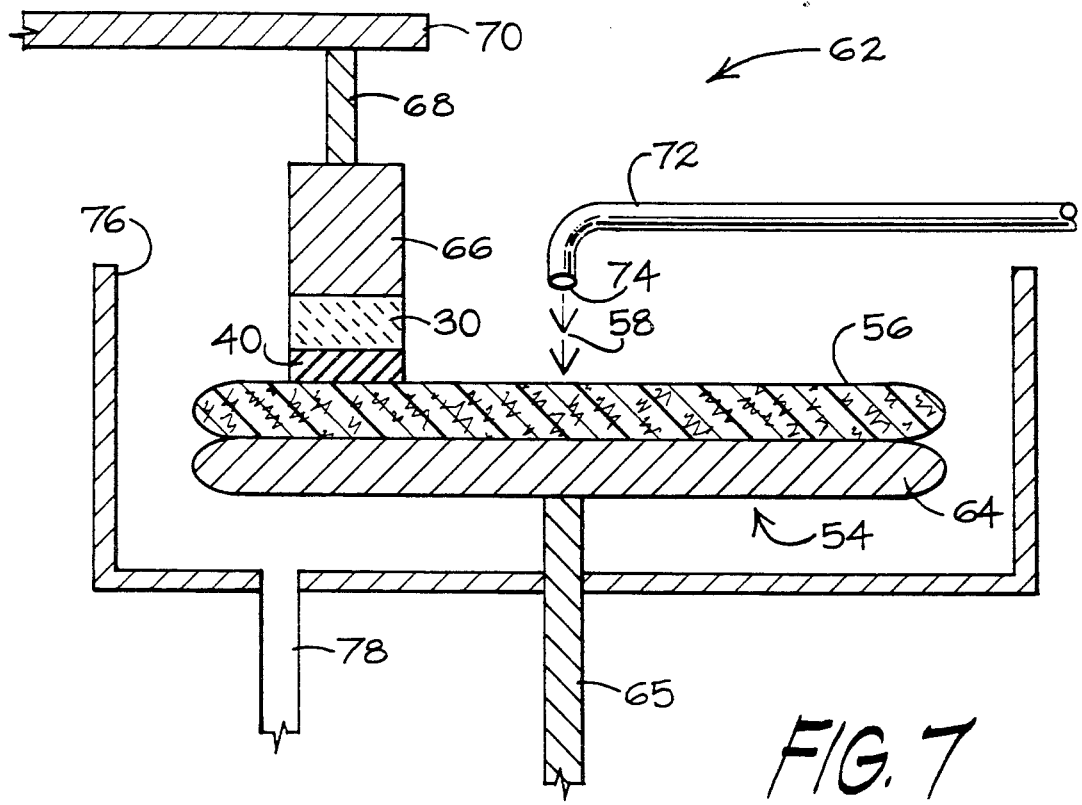
FIG. 7 is a cross-sectional view of an apparatus for performing the present invention.

FIG. 7 illustrates a cross-sectional view of an apparatus 62 for performing the present invention. Apparatus 62 includes pad 56 removably mounted on platten 64. Platten spindle 65 is fixed to the underside of platten 64. Substrate 30 is removably mounted on the side opposite defective metallization layer 40 to chuck 66. Chuck spindle 68 is fixed to the top of chuck 66 and the bottom of polishing arm 70. Slurry dispenser 72 has outlet 74 positioned in close proximity to the center of pad 56. Sink 76 provides containment for flung-out materials which exit through drain 78. A preferred operation of apparatus 62 is now described. Initially polishing arm 70 holds substrate 30 above but not contacting pad 56. Platten spindle 65 provides rotation for platten 64 and pad 56. Slurry dispenser 72 dispenses slurry 58, depicted in the figure by a series of arrows, through outlet 74. After contacting rotating pad 56 the slurry 58 is flung-out centrifugally toward the outer edge of pad 56. Chuck spindle 68 provides rotation for chuck 66 and substrate 30 so that a rotating substrate 30 is positioned above a slurry-covered rotating pad 56. Thereafter polishing arm 70 is actuated downward and brings defective metallization layer 40 of substrate 30 in contact with pad 56 and slurry 58. Polishing arm 70 continues to exert a downward pressure to enable pad 56 and slurry 58 to polish and grind away defective metallization layer 40. Excess slurry 58 and material grinded off defective metallization layer 40 exits through drain 78. Periodically an operator can retract polishing means 54 to observe how the removal of defective metallization layer 40 is progressing. When defective metallization layer 40 is observed to be completely removed no further polishing is required. If the surface finish is not sufficiently smooth then an additional polish using a softer pad and/or a less abrasive slurry can be employed.

Figure 8:
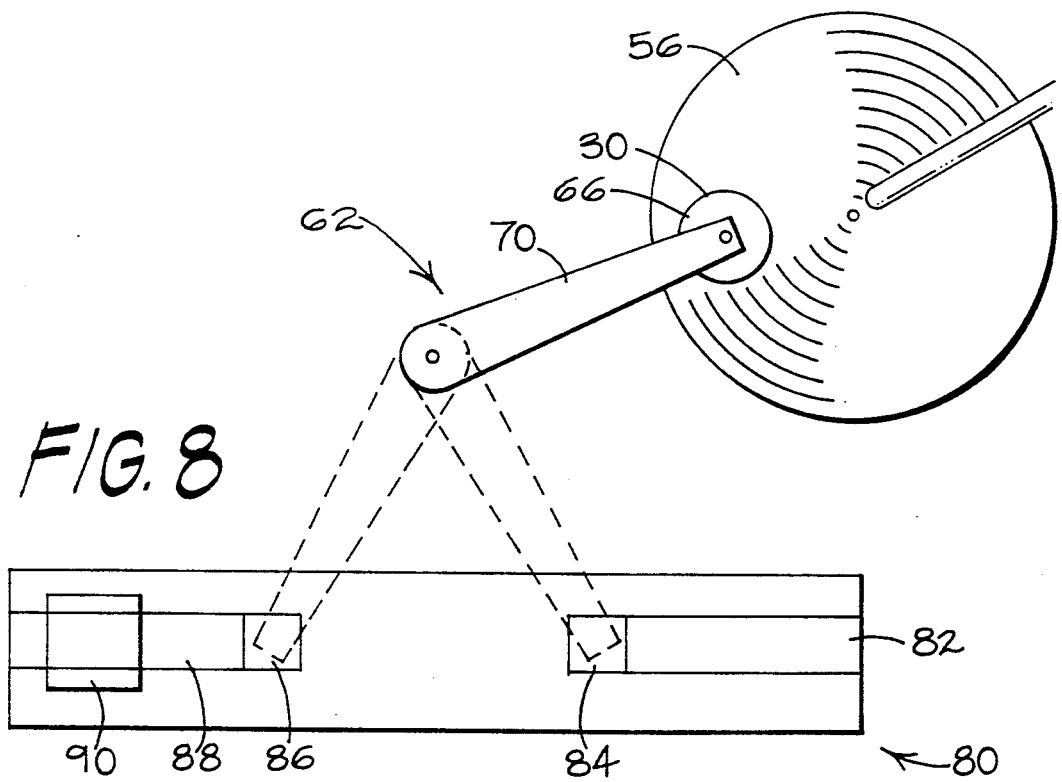
FIG. 8 is a plan view of the apparatus in FIG. 7 along with a substrate loading mechanism.

FIG. 8 illustrates a plan view of apparatus 62 in conjunction with substrate loading means 80. Inlet cassette 82 delivers substrate 30 to inlet receptacle 84. Polishing arm 70 can then swivel and load substrate 30 onto chuck 66. Polishing arm 70 then swivels to position substrate 30 above rotating pad 56. Defective metallization is then removed from substrate 30 as previously described, and polishing arm 70 swivels and deposits substrate 30 into outlet receptacle 86. Outlet cassette 88 is then activated to pull substrate 30 through deionized water bath 90, and simultaneously polishing arm 70 can swivel and receive another defective substrate 30 from inlet receptacle 84.

The present invention, therefore, is well adapted to carry out the objects and attain the ends and advantages mentioned, as well as others inherent therein. While presently preferred embodiments of the invention have been described for the purpose of disclosure, numerous changes in the details of construction, and steps of the process, will be readily apparent to those skilled in the art and which are encompassed within the spirit of the present invention and the scope of the appended claims.

What is claimed is:

1. A method of correcting a defective metallization layer on an electronic component, comprising: providing an electronic component with a substantially planar defective metallization layer on a substantially planar base layer;
    removing the defective metallization layer by applying a polishing pad with a substantially planar polishing surface so that the entire defective metallization layer is removed from the base layer; and
    fabricating a new substantially planar metallization layer on the base layer to replace the defective metallization layer, thereby reworking the component.

2. The method of claim 1 wherein the polishing is performed by a rotating pad and a slurry.

3. The method of claim 2 wherein the electronic component is an integrated circuit.

4. The method of claim 2 wherein the electronic component is a substrate.

5. The method of claim 4 wherein the substrate comprises a polymeric dielectric.

6. The method of claim 5 wherein the polymeric dielectric is polyimide.

7. The method of claim 6 wherein the defective metallization layer comprises copper.

8. The method of claim 4, further comprising the step of:
    testing the top metallization layer and detecting a defect prior to polishing.

9. The method of claim 4 wherein the defective metallization layer is disposed on at least one underlying metallization layer.

10. The method of claim 9 wherein said at least one underlying metallization layer is not damaged by polishing the defective metallization layer.

11. The method of claim 1 wherein the defect is a bent metal segment.

12. The method of claim 1 wherein the defect is a metal segment which is too low.

13. The method of claim 1 wherein the defect is a metal segment which has an electrical opening.

14. The method of claim 1 wherein the defect is a pair of metal segment short-circuited together by a metal fragment.

* * * * *

UNITED STATES PATENT AND TRADEMARK OFFICE
CERTIFICATE OF CORRECTION

PATENT NO. : 5,142,828

DATED : 09/01/92

INVENTOR(S) : CURRY, II

It is certified that error appears in the above—identified patent and that said Letter Patent is hereby corrected as shown below:

Column 2, line 34, delete -- 16, -- before the second occurrence of "14".

Column 2, line 37, change "14, 16" to -- 16, 14 --.

Column 6, line 40, change "segment" to -- segments --.

Signed and Sealed this

Seventh Day of June, 1994

Attest:

BRUCE LEHMAN

Attesting Officer

Commissioner of Patents and Trademarks